United States Patent
Kim et al.

(10) Patent No.: US 10,734,598 B2
(45) Date of Patent: Aug. 4, 2020

(54) ORGANIC LIGHT-EMITTING ELEMENT AND ORGANIC LIGHT-EMITTING DISPLAY DEVICE USING THE SAME

(71) Applicant: LG Display Co., Ltd., Seoul (KR)

(72) Inventors: Seok-Hyun Kim, Goyang-si (KR); Eun-Jung Park, Goyang-si (KR); Tae-Shick Kim, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/116,018

(22) Filed: Aug. 29, 2018

(65) Prior Publication Data

US 2019/0165304 A1    May 30, 2019

(30) Foreign Application Priority Data

Nov. 30, 2017 (KR) .......................... 10-2017-0163769

(51) Int. Cl.
*H01L 51/52* (2006.01)
*H01L 51/50* (2006.01)
*H01L 27/32* (2006.01)

(52) U.S. Cl.
CPC ...... *H01L 51/5221* (2013.01); *H01L 27/3248* (2013.01); *H01L 51/5092* (2013.01); *H01L 51/5234* (2013.01); *H01L 2251/301* (2013.01); *H01L 2251/5315* (2013.01); *H01L 2251/558* (2013.01)

(58) Field of Classification Search
CPC ............. H01L 51/5215; H01L 51/5092; H01L 51/5234

USPC ........................................................... 257/40
See application file for complete search history.

(56) References Cited

U.S. PATENT DOCUMENTS

| 2013/0026456 | A1  | 1/2013  | Hwang et al. |
| 2014/0103301 | A1* | 4/2014  | Lee ..................... H01L 51/0071 257/40 |
| 2015/0236296 | A1  | 8/2015  | Yoon et al. |
| 2016/0133880 | A1* | 5/2016  | Lee ..................... H01L 51/5281 257/40 |
| 2017/0294628 | A1* | 10/2017 | Kim ..................... H01L 51/5253 |
| 2018/0190940 | A1* | 7/2018  | Liu ..................... H01L 51/5275 |

FOREIGN PATENT DOCUMENTS

| CN | 106848082 A     | 6/2017  |
| CN | 106953020 A     | 7/2017  |
| JP | 2002324672 A    | 11/2002 |
| TW | 201414800 A     | 4/2014  |
| WO | 20120023177 A1  | 2/2012  |

OTHER PUBLICATIONS

Taiwanese Office Action issued in the corresponding Taiwanese Patent Application No. 107127635 dated Aug. 13, 2019.
Japanese Office Action issued in the corresponding Japanese Patent Application No. 2018-131856 dated Sep. 3, 2019.

* cited by examiner

*Primary Examiner* — David Vu
*Assistant Examiner* — Brandon C Fox
(74) *Attorney, Agent, or Firm* — Polsinelli PC

(57) ABSTRACT

Disclosed is an organic light-emitting element and organic light-emitting display device using the same, which has light transmission, is capable of reducing the resistance of the element, and is reliable regardless of variation in temperature or environment.

22 Claims, 14 Drawing Sheets

ORGANIC LIGHT-EMITTING ELEMENT AND ORGANIC LIGHT-EMITTING DISPLAY DEVICE USING THE SAME

CROSS REFERENCE TO RELATED APPLICATION

This application claims the benefit of Korean Patent Application No. 10-2017-0163769, filed on Nov. 30, 2017, which is hereby incorporated by reference in its entirety as if fully set forth herein.

BACKGROUND

Field of the Disclosure

The present disclosure relates to an organic light-emitting element, and more particularly, to an organic light-emitting element having an upper electrode, which has light transmission, is capable of reducing the resistance of the element, and is reliable regardless of variation in temperature or environment, and an organic light-emitting display device using the same.

Description of the Background

With the advent of the information age, the field of displays that visually display electrically conveyed information signals has rapidly been developed. In response, various flat panel display devices having excellent performance, such as thinner and lighter designs and less power consumption, have been developed and are rapidly replacing conventional cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, an organic light-emitting display device is considered to be a competitive application because it requires no separate light source and realizes device compactness and vivid color display.

An organic light-emitting display device includes a plurality of organic light-emitting elements provided in a plurality of subpixels on a substrate. Each organic light-emitting element corresponds to each subpixel for light emission. Then, the organic light-emitting element includes an anode, a cathode, as well as a hole transport layer, an emission layer, and an electron transport layer that are sequentially provided between the anode and the cathode.

The organic light-emitting element is configured to emit light when an electric field is applied between the anode and the cathode. The organic light-emitting element is capable of being driven at a low voltage, consumes relatively low power, has a small weight, and may also be manufactured on a flexible substrate.

The organic light-emitting display device emits light using organic light-emitting elements provided in respective subpixels for light emission. In each organic light-emitting element, excitons are produced via combination of electrons and holes in the emission layer, and when energy of the excitons falls to the ground state, light is generated. The luminance efficacy thereof is determined based on the efficiency of combination of the electrons and the holes in the emission layer.

Meanwhile, the organic light-emitting element is classified into a top-emission type and a bottom-emission type, based on the direction in which light is emitted from the organic light-emitting element. In either type, a reflective electrode is provided on the surface of the organic light-emitting element opposite the surface from which light is emitted, and the light emitted from the organic light-emitting element is used in a given direction.

Among these, recently, the top-emission type, which enables freedom in an element configuration underside the reflective electrode, has been actively studied.

In the top-emission-type organic light-emitting element, an upper electrode thereof needs to be transparent or translucent for the transmission of light. However, in the case of the organic light-emitting display device having the organic light-emitting element, a viewer may view the screen not only from the front but also from an oblique direction, and at this time, a phenomenon in which the color of the screen differs depending on viewing angle is observed. Since such color deviation depending on viewing angle mainly occurs when the upper electrode is thick, an attempt to reduce the thickness of the upper electrode has recently been made.

However, the upper electrode serves to supply an electric field to the organic light-emitting element or to stabilize the organic light-emitting element, and thus needs to secure predetermined conductivity. In this regard, the upper electrode may be configured with a translucent electrode that is capable of being made thinner than a transparent electrode. The translucent upper electrode, however, is increased in resistance when the thickness thereof is reduced, and causes worsened color deviation depending on viewing angle when the thickness thereof is increased. Therefore, current top-emission-type organic light-emitting elements and organic light-emitting display devices using the same need to reduce both color deviation depending on viewing angle and resistance thereof.

In addition, the organic light-emitting display device has recently been used in portable cellular phones, e-books, and various other exploration devices, and needs to operate with stability under various environments. In general, current organic light-emitting display devices, which have a fixed form or are considered to be ideal for use at room temperature, do not meet these requirements.

SUMMARY

Accordingly, the present disclosure is directed to an organic light-emitting element and an organic light-emitting display device using the same that substantially obviate one or more problems due to limitations and disadvantages of the related art.

The present disclosure has been provided to solve the problems described above, and an object of the present disclosure is to provide an organic light-emitting element having an upper electrode, which has light transmission, is capable of reducing the resistance of the element, and is reliable regardless of variation in temperature or in the environment, and an organic light-emitting display device using the same.

Additional advantages and features of the disclosure will be set forth in part in the description which follows and in part will become apparent to those having ordinary skill in the art upon examination of the following or may be learned from practice of the disclosure. The advantages of the disclosure may be realized and attained by the structure particularly pointed out in the written description and claims hereof as well as the appended drawings.

An organic light-emitting element and an organic light-emitting display device using the same according to the present disclosure may not only achieve a reduction in resistance on the exit side of light but also maintain translucency through the configuration of an upper electrode and an interfacial compensation layer that is in contact with the upper electrode, and may also secure a stabilized driving voltage and luminous efficacy regardless of variation in temperature and/or environment.

To achieve one or more of these and advantages and in accordance with the purpose of the disclosure, as embodied and broadly described herein, an organic light-emitting element includes a lower electrode, at least one organic layer on the lower electrode, an upper electrode disposed on the organic layer and configured to transmit light from the organic layer, and an interfacial compensation layer provided on the upper electrode and including a first material as a halogen compound and a second material as a metal that is reactive with halogen or a non-metal.

The second material may be any one or more of barium (Ba), cerium (Ce), cesium (Cs), europium (Eu), gadolinium (Gd), potassium (K), lithium (Li), lutetium (Lu), sodium (Na), neodymium (Nd), rubidium (Rb), scandium (Sc), samarium (Sm), strontium (Sr), ytterbium (Yb), and yttrium (Y).

The interfacial compensation layer may further include a third material as a metal included in the upper electrode.

The second material of the interfacial compensation layer may have a highest molar ratio (or atomic ratio depending on the type of the material), and the first material and the third material may have the same molar ratio (or atomic ratio depending on the type of the material).

The upper electrode may include at least a first layer and a second layer, and the first material of the interfacial compensation layer may be a compound of halogen and a metal included in the first layer that is in contact with the organic layer.

The first material may be LiF.

The upper electrode may be formed by laminating one or more metal layers, and the second material may further be included in at least one metal layer of the upper electrode.

The second layer may include Ag:Mg.

Ag in the second layer may have a molar ratio of three times to ten times that of Mg.

The sum of thicknesses of the upper electrode and the interfacial compensation layer may range from 100 Å to 180 Å.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
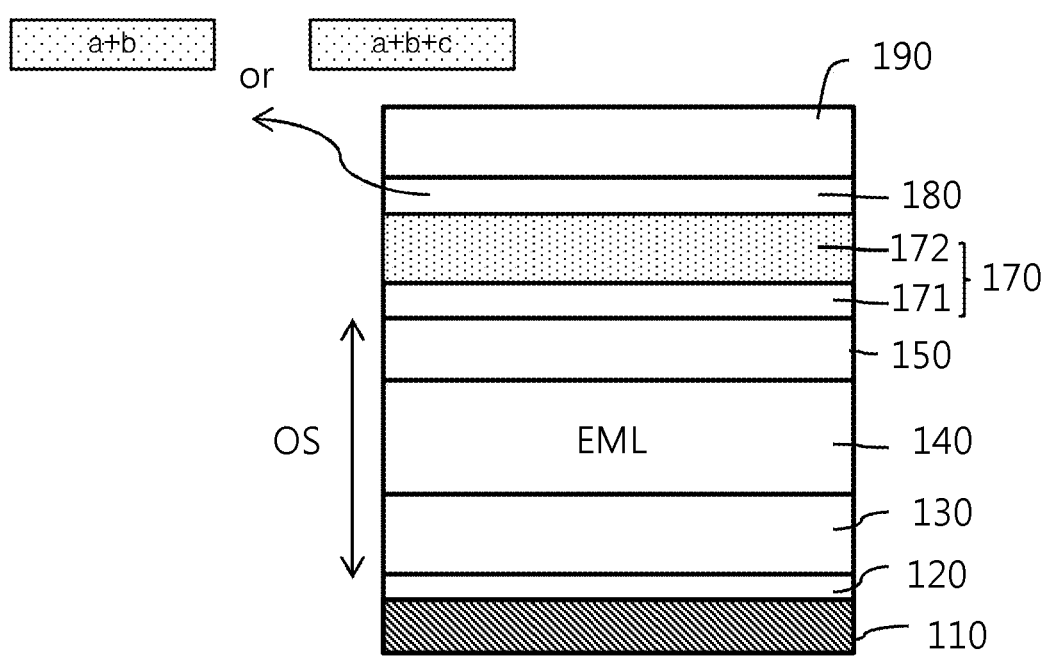
FIG. 1 is a cross-sectional view illustrating an example of an organic light-emitting element of the present disclosure.

The advantages and features of the present disclosure and the way of attaining them will become apparent with reference to aspects described below in detail in conjunction with the accompanying drawings. The present disclosure, however, is not limited to the aspects disclosed hereinafter and may be embodied in many different forms. Rather, these exemplary aspects are provided so that this disclosure will be through and complete and will fully convey the scope to those skilled in the art. Thus, the scope of the present disclosure should be defined by the claims.

The shapes, sizes, ratios, angles, numbers, and the like, which are illustrated in the drawings in order to describe various aspects of the present disclosure, are merely given by way of example, and therefore, the present disclosure is not limited to the illustrations in the drawings. The same or extremely similar elements are designated by the same reference numerals throughout the specification. In addition, in the description of the present disclosure, a detailed description of related known technologies will be omitted when it may make the subject matter of the present disclosure rather unclear. In the present specification, when the terms "comprises", "includes", and the like are used, other elements may be added unless the term "only" is used. An element described in the singular form is intended to include a plurality of elements unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using "on", "above", "below", "aside", or the like, one or more other parts may be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions may not occur in succession unless the term "directly" or "just" is used.

In the description of the various aspects of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless otherwise mentioned.

The respective features of the various aspects of the present disclosure may be partially or wholly coupled to and combined with each other, and various technical linkages and driving thereof are possible. These various aspects may be performed independently of each other, or may be performed in association with each other.

In this specification, a stack means a unit structure that includes organic layers such as a hole transport layer and an electron transport layer and an organic emission layer interposed between the hole transport layer and the electron transport layer. The organic layers may further include a hole injection layer, an electron blocking layer, a hole blocking layer, and an electron injection layer, and may further include other organic layers according to the structure or design of an organic light-emitting element.

Figure 2:
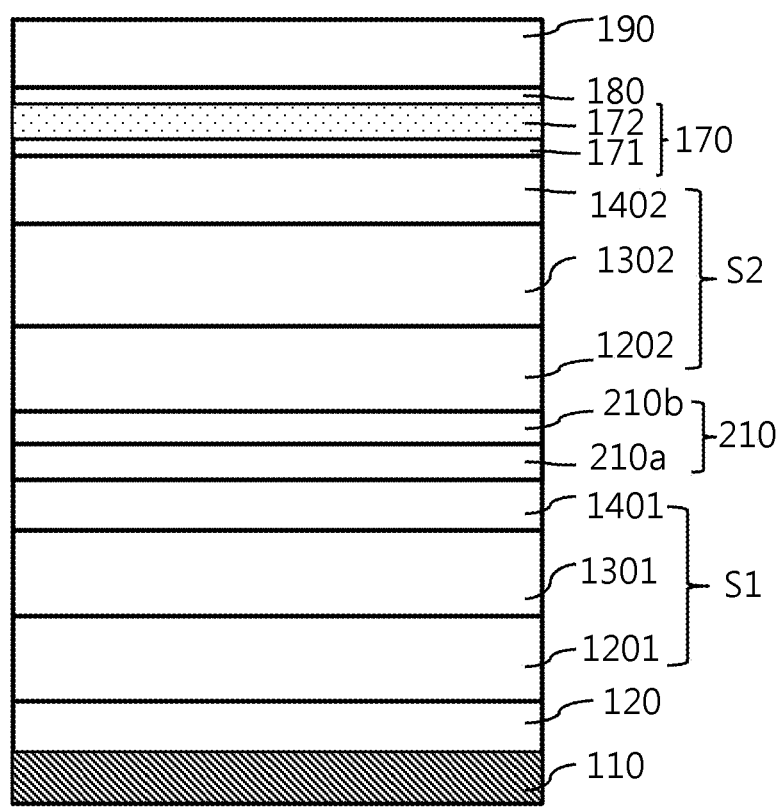
FIG. 2 is a cross-sectional view illustrating an organic light-emitting element according to a modification of the present disclosure.

FIG. 1 is a cross-sectional view illustrating an example of an organic light-emitting element of the present disclosure, and FIG. 2 is a cross-sectional view illustrating an organic light-emitting element according to a modification of the present disclosure.

The organic light-emitting element of the present disclosure is based on a top-emission type.

Thus, as illustrated in FIG. 1, the organic light-emitting element of the present disclosure includes a lower electrode 110, an organic stack OS including at least one organic emission layer 140, and an upper electrode 170, which are formed in sequence. Among these, the lower electrode 110 includes a reflective electrode for reflecting light that is discharged downwards from the organic emission layer 140 and returns the light to a top exit side. The lower electrode 110 may be configured with a single reflective electrode, or may be configured with a multilayer laminate including at least a reflective electrode and a transparent electrode. In the structure of the laminate, the lower electrode 110 may include a transparent electrode located on the surface thereof facing the organic stack OS.

In addition to the organic emission layer 140, the organic stack OS further includes a hole transport layer 130 under the organic emission layer 140 and an electron transport layer 150 above the organic emission layer 140. The hole transport layer 130 and the electron transport layer 150 are provided to transport holes and electrons to the organic emission layer 140.

In addition, a hole injection layer 120 is further provided between the lower electrode 110 and the organic stack OS, and serves to assist in the injection of holes from the lower electrode 110 to the organic stack OS by reducing a barrier at a first interface between the organic stack OS and the lower electrode 110, which is formed of an inorganic material.

The organic light-emitting element is provided in each subpixel of an organic light-emitting display device, each subpixel includes at least one transistor, and the organic light-emitting element is electrically connected to the transistor of each subpixel. Here, the lower electrode 110 is directly electrically connected to the transistor on a per subpixel basis, whereas one upper electrode 170 is provided for a plurality of subpixels.

As described above, the upper electrode 170 is the exit side, and thus needs to be transparent or translucent. Moreover, since the upper electrode 170 is provided over a plurality of subpixels of the display device, the upper electrode 170 needs to be formed of a metal having predetermined conductivity or greater in order to supply a uniform potential without variation from region to region.

Therefore, the metal that is used to form the upper electrode 170 may be formed by deposition of Ag:Mg to thus have both semi-transparency (translucency) and predetermined conductivity or greater, rather than being a transparent conductive oxide layer such as an indium tin oxide (ITO) layer having large sheet resistance.

However, when the upper electrode 170 is configured as a single Ag:Mg layer having a thickness of approximately 200 Å, color deviation may occur depending on viewing angle. When attempting to reduce the thickness of the Ag:Mg layer in order to solve this problem, also it is necessary to increase the content of Ag in the Ag:Mg layer in order to increase conductivity even in the thinner upper electrode 170. At this time, increased Ag causes cohesion of itself in the Ag:Mg layer and makes the properties of the upper electrode 170 unstable, which causes the shortened lifespan of the organic light-emitting element due to deterioration over time.

In the top-emission-type organic light-emitting element of the present disclosure, by applying an interfacial compensation layer 180 to the upper electrode 170, which serves as the exit side, it is possible to prevent Ag cohesion despite the high content of Ag in the Ag:Mg upper electrode 170 having a small thickness, and consequently, to stably maintain the properties of the upper electrode 170.

Meanwhile, Ag:Mg is included in the upper electrode 170 of the present disclosure in a ratio different from that of Mg:Ag, which is known as a cathode of a bottom-emission-type organic light-emitting element. That is, in the Mg:Ag cathode used in a general bottom-emission-type organic light-emitting element, the molar ratio of Mg:Ag is 10:1, and the main component thereof is Mg. In contrast, in the Ag:Mg electrode of the present disclosure, in order to secure sufficient conductivity with a small thickness for maintaining translucency, Ag is included in a greater amount and has an molar ratio of three times to ten times that of Mg. In this case, Mg functions to prevent Ag cohesion and is included in a small amount in the upper electrode 170.

The upper electrode 170 may be formed of a metal in a single layer, or may include a first layer 171, which is formed of an inorganic compound with a small thickness, and a second layer 172, which substantially functions as a cathode on the first layer 171, as illustrated in FIG. 1. The first layer 171 is formed to have a thickness of approximately 10 Å to approximately 30 Å, and the second layer 172 is formed to have a thickness of approximately 100 Å to approximately 150 Å. In this case, the first layer 171 may be formed of an inorganic compound, such as LiF and $Li_2O$, an alkali metal such as Li, Ca, Mg, and Sm, an alkali earth metal, or an inorganic compound thereof, and after the organic stack OS is formed, the first and second layer 171 and 172 may be successively formed using different materials through the same process, such as deposition and sputtering. The first layer 171 may be formed of a transparent halogen compound, and for the discharge of light from the emission layer 140, the second layer 172 has the small thickness that is required in order to maintain transmissivity or semi-transmissivity (translucency). When the upper electrode 170 is a single layer, the single layer may contain Ag and Mg as main components, and the interfacial compensation layer 180 may include a first material a and a second material b, or may include first to third materials a, b, and c. The second material b of the interfacial compensation layer 180 may also be included in the upper electrode 170.

In some cases, the first layer 171 may further include a metal component included in the second layer 172.

The interfacial compensation layer 180, which is disposed on the upper electrode 170, includes the first material a, which is a halogen compound, and the second material b, which is reactive with halogens or non-metals.

The first material a of the interfacial compensation layer 180 is a halogen compound, and, for example, may be a compound of halogen and a metal that is included in the first layer 171, which is in contact with the above-described organic layer. Here, the metal may be an alkali metal or an alkali earth metal, and a representative halogen is F, Br, Cl, or the like. The most known halogen compound is LiF.

The first material (a) maintains transmittance and a refractive index in the interface compensation layer 180 at a constant level, and even if the second material (b) has a high absorbability to the light, so the light emitted from the organic stack OS can maintain efficiency at a certain level.

Here, the metal as the second material b is a metal having monovalent, divalent, or trivalent ionization tendency, may be any one of an alkali metal, an alkali earth metal, a lanthanum metal, and an actinium metal, and for example, may be any one of barium (Ba), cerium (Ce), cesium (Cs), europium (Eu), gadolinium (Gd), potassium (K), lithium (Li), lutetium (Lu), sodium (Na), neodymium (Nd), rubidium (Rb), scandium (Sc), samarium (Sm), strontium (Sr), ytterbium (Yb), and yttrium (Y). These examples of the second material b are metals that are strongly reactive with halogens and other non-metals. The second material b is disposed on the upper electrode 170 to prevent cohesion of Ag included in the upper electrode 170 and to compensate for the interface of the upper electrode 170.

In addition, the second material b is mixed with the halogen compound a at high reactivity, and thus has stability in light of quality properties. In particular, as will be described below, the second material b of the interfacial compensation layer 180 of the present disclosure has a major function of preventing variation of the organic stack OS or the upper electrode 170 over time even in harsh environments such as being exposed in a solar light including ultraviolet rays. This serves to prevent cohesion of Ag included in the upper electrode 170 and to maintain reactivity between Ag and Mg with a predetermined ratio, thereby preventing variation in the efficiency and driving voltage of the organic light-emitting element over time, and resulting in element stability. In addition, the components of the halogen compound a lower the energy barrier of the upper electrode 170 and facilitate the injection of electrons. In this case, although the halogen compound a has high ionization tendency, even if the halogen compound a is subjected to ion separation, the ionized material again reacts with the second material b, which is another component of the interfacial compensation layer 180 due to the high reactivity between halogen and the second material b, whereby ions of the halogen compound have no effect on the organic light-emitting element and the properties of the interfacial compensation layer 180 and the upper electrode 170 are maintained.

Accordingly, the second material b of the interfacial compensation layer 180 may have a high molar ratio (atomic or molecular ratio) relative to the first material a for the function thereof.

In addition, the thickness of the interfacial compensation layer 180 ranges from approximately 10 Å to approximately 30 Å, which is the level at which the permeation of light emitted from the emission layer 140 in the organic stack OS is not hindered. Here, the sum of the thicknesses of the upper electrode 170 and the interfacial compensation layer 180 ranges from 100 Å to 180 Å. Within this thickness range, the upper electrode 170 and the interfacial compensation layer 180 are translucent and do not cause color deviation upon discharge of the light emitted from the organic stack OS thereunder.

The interfacial compensation layer 180 may further include the third material c, which is a metal included in the upper electrode 170. That is, when the upper electrode 170 is formed of an Ag:Mg alloy, Ag or Mg may further be included, as the third material c, in the interfacial compensation layer 180. In this case, in the interfacial compensation layer 180, the molar ratio of the second material b (atomic or molecular ratio) may be the highest, and the first material a and the third material c may have the same atomic or molecular ratio. In addition, even when the interfacial compensation layer 180 includes three materials, the thickness thereof ranges from approximately 10 Å to approximately 30 Å, which is the level at which the permeation of light emitted from the emission layer 140 in the organic stack OS is not hindered.

After the interfacial compensation layer 180 is formed, a capping layer 190 is provided in order to protect the organic light-emitting element and to increase the luminous efficacy thereof. The capping layer 190 is formed of an organic compound having transmissivity and has a refractive index ranging from approximately 1.6 to approximately 2.1.

FIG. 2 illustrates a modification of the organic light-emitting element of FIG. 1, in which the single organic stack OS is replaced with a plurality of stacks S1 and S2 with a charge generation layer 210 interposed therebetween. The modification illustrates two stacks S1 and S2, but the present disclosure is not limited thereto, and may include three or more stacks.

In this case, each of the stacks S1 and S2 includes a hole transport layer 1201 or 1202, an emission layer 1301 or 1302, and an electron transport layer 1401 or 1402, in the same manner as the inorganic stack OS of FIG. 1 described above.

In addition, the charge generation layer 210 may be a single layer in which an n-type dopant and a p-type dopant are included in a predetermined host. Alternatively, as illustrated, different hosts may be doped respectively with an n-type dopant and a p-type dopant so that an n-type charge generation layer 210a and a p-type charge generation layer 210b may be laminated on each other.

With regard to this tandem type in which a plurality of stacks is laminated, since the organic light-emitting element of the present disclosure is characterized by the upper electrode and the interfacial compensation layer in contact with the top of the upper electrode, the emission layers included in the respective stacks may be the same colored emission layers, in which the same color of light is emitted in subpixels, or may be different emission layers in which light in a complementary relationship is emitted from the different stacks and is finally added so that white light is emitted. In the former case, when the organic light-emitting display device includes such organic light-emitting elements, a color filter may further be provided on the exit side of each organic light-emitting element so as to realize different colors on a per subpixel basis.

A description related to the lower electrode 110, the hole injection layer 120, the upper electrode 170, the interfacial compensation layer 180, and the capping layer 190, which are the same as those in FIG. 1, is omitted.

Hereinafter, the effects obtained when the organic light-emitting element of the present disclosure includes the upper electrode and the interfacial compensation layer will be described in comparison with comparative examples.

In comparative examples and aspects, an Ag:Mg alloy is commonly used as a main metal of the upper electrode. This may be replaced with a different metal, as long as it has the same level of semi-transmissivity, is thin so as to cause no increase in resistance, and has no large work function when electrons are injected into an adjacent organic stack. In addition, LiF is used as a halogen compound. Fluorine (F) may be replaced with any other type of halogen material, and Li may be replaced with any other alkali metal or alkali earth metal.

Figure 3A:
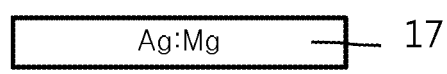
FIGS. 3A to 3C are views illustrating the structure of an upper electrode of an organic light-emitting element according to first to third comparative examples.
Figure 3B:
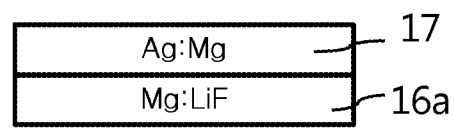
Figure 3C:
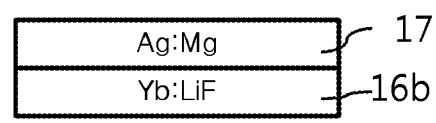

FIGS. 3A to 3C are views illustrating the structure of an upper electrode of an organic light-emitting element according to first to third comparative examples.

The first comparative example illustrates an upper electrode 17 formed of an Ag:Mg alloy layer, as illustrated in FIG. 3A. In the second comparative example, as illustrated in FIG. 3B, a double-layered upper electrode includes a first layer 16a formed of Mg and LiF and a second layer 17 formed of an Ag:Mg alloy layer.

In the third comparative example, as illustrated in FIG. 3C, the first layer 16a is formed of Yb and LiF, unlike FIG. 3B.

That is, as illustrated in FIGS. 3A to 3C, the first to third comparative examples commonly include only the upper electrode, without the interfacial compensation layer.

Hereinafter, several aspects of the structure including the upper electrode and the interfacial compensation layer, which is in contact with the upper electrode, in the organic light-emitting element of the present disclosure will be described. Then, the representative second material b included in the interfacial compensation layer 180 will be described as Yb by way of example. As described above, Yb may be replaced with any one of an alkali metal, an alkali earth metal, a lanthanum metal, and an actinium metal.

In addition, in the aspects, the first layer 171 functions as an electron injection layer. In some cases, the first layer 171 may be formed of a single alkali metal, such as Li, Ca, Mg, and Sm, or alkali earth metal, instead of LiF. In addition, LiF may be replaced with a halogen compound of these metals and fluorine, or other types of halogen materials.

FIGS. 4A to 4E are cross-sectional views illustrating an upper electrode and an interfacial compensation layer of an organic light-emitting element according to a first aspect to a fifth aspect of the present disclosure.

Figure 4A:
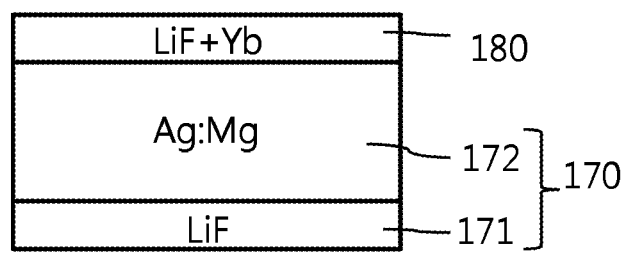
FIGS. 4A to 4E are cross-sectional views illustrating an upper electrode and an interfacial compensation layer of an organic light-emitting element according to a first aspect to a fifth aspect of the present disclosure.

As illustrated in FIG. 4A, in the organic light-emitting element according to the first aspect of the present disclosure, the first layer 171 is formed of LiF, the second layer 172 is formed of an Ag:Mg alloy, and the interfacial compensation layer 180 there-above is formed of a mixture of LiF and Yb.

Figure 4B:
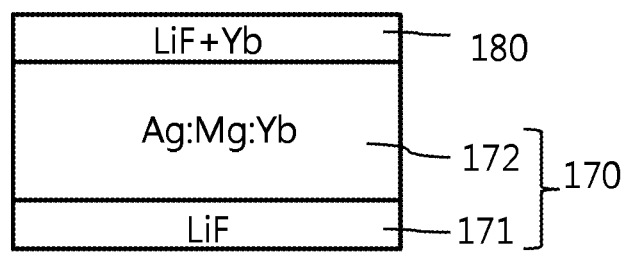

As illustrated in FIG. 4B, in the organic light-emitting element according to the second aspect of the present disclosure, the first layer 171 is formed of LiF, the second layer 172 is formed of an Ag:Mg:Yb alloy, and the interfacial compensation layer 180 there-above is formed of a mixture of LiF and Yb.

Figure 4C:
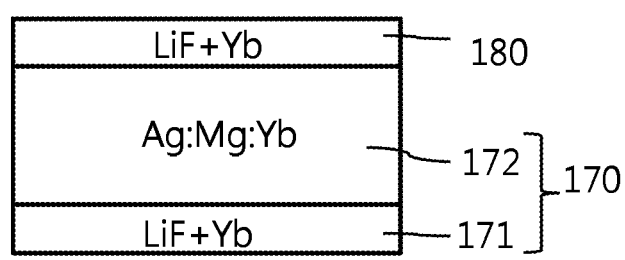

As illustrated in FIG. 4C, in the organic light-emitting element according to the third aspect of the present disclosure, the first layer 171 is formed of a mixture of LiF and Yb, the second layer 172 is formed of an Ag:Mg:Yb alloy, and the interfacial compensation layer 180 there-above is formed of a mixture of LiF and Yb. Yb is included in all of the successive three layers.

Figure 4D:
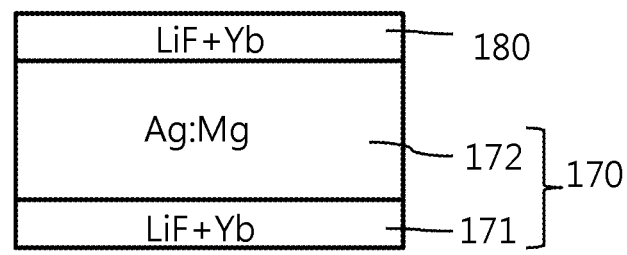

As illustrated in FIG. 4D, in the organic light-emitting element according to the fourth aspect of the present disclosure, both the first layer 171 and the interfacial compensation layer 180 include Yb, excluding the second layer 172. In this case, both the first layer 171 and the interfacial compensation layer 180 are formed of LiF and Yb, and the second layer 172 is formed of an Ag:Mg alloy.

Figure 4E:
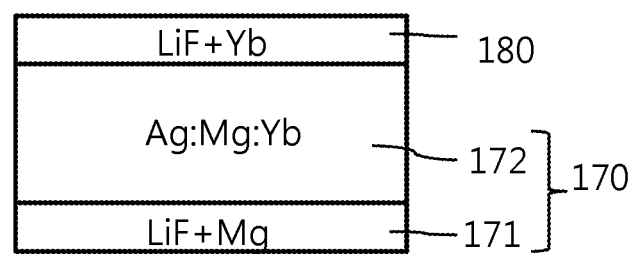

As illustrated in FIG. 4E, the organic light-emitting element according to the fifth aspect of the present disclosure has a difference in that Yb, which is included in the mixture of LiF and Yb of the first layer 171 according to the third aspect, is replaced with Mg. When Mg is included in the first layer 171 as the main metal component of the upper electrode 170, cohesion of Ag in the second layer 172 may also be prevented by the first layer 171 thereunder.

In this way, the first to fifth aspects of FIGS. 4A to 4E are configured in common such that the interfacial compensation layer 180 is formed of a mixture of LiF and Yb. Then, the interfacial compensation layer 180, which is formed by mixing a halogen compound with a metal that is strongly reactive with halogens or non-metals, may stabilize the layer quality of the second layer 172, which contains Ag and Mg as main components, thereby preventing Ag cohesion in the second layer 172 and stabilizing the surface properties thereof. Thereby, the upper electrode 170 may remain stable when driven for a long time, and the lifespan of the organic stack OS may be increased.

FIGS. 5A to 5E are cross-sectional views illustrating an upper electrode and an interfacial compensation layer of an organic light-emitting element according to a sixth aspect to a tenth aspect of the present disclosure.

In the organic light-emitting element according to the sixth aspect to the tenth aspect of the present disclosure illustrated in FIGS. 5A to 5E, the interfacial compensation layer 180 commonly includes LiF, Yb, and Mg. Here, Mg is a component included in the second layer 172.

Figure 5A:
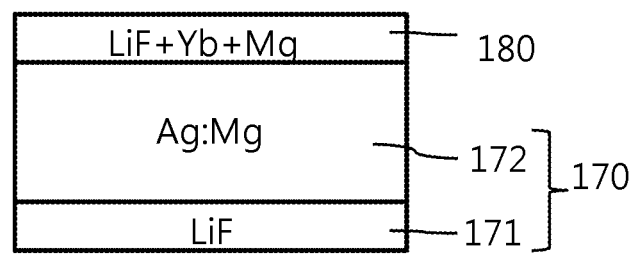
FIGS. 5A to 5E are cross-sectional views illustrating an upper electrode and an interfacial compensation layer of an organic light-emitting element according to a sixth aspect to a tenth aspect of the present disclosure.

As illustrated, in FIG. 5A, in the organic light-emitting element according to the sixth aspect of the present disclosure, the first layer 171 is formed of LiF, the second layer 172 is formed of an Ag:Mg alloy, and the interfacial compensation layer 180 there-above is formed of a mixture of LiF, Yb, and Mg.

Figure 5B:
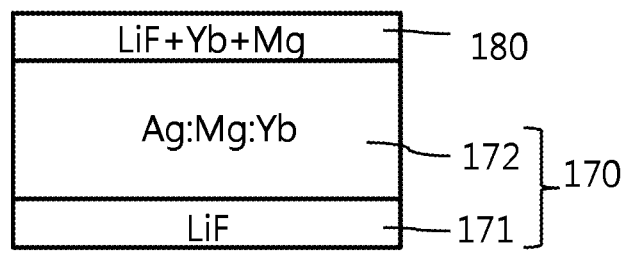

As illustrated in FIG. 5B, in the organic light-emitting element according to the seventh aspect of the present disclosure, the first layer 171 is formed of LiF, the second layer 172 is formed of an Ag:Mg:Yb alloy, and the interfacial compensation layer 180 there-above is formed of a mixture of LiF, Yb, and Mg.

Figure 5C:
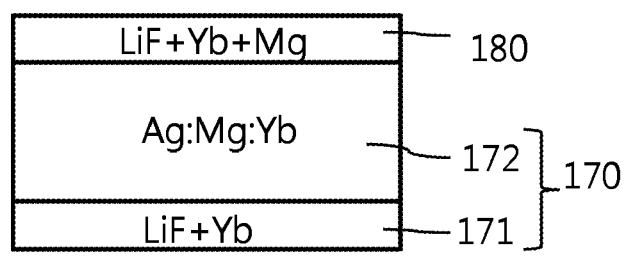

As illustrated in FIG. 5C, in the organic light-emitting element according to the eighth aspect of the present disclosure, the first layer 171 is formed of a mixture of LiF and Yb, the second layer 172 is formed of an Ag:Mg:Yb alloy, and the interfacial compensation layer 180 there-above is formed of a mixture of LiF, Yb, and Mg. Yb is included in all of the successive three layers.

Figure 5D:
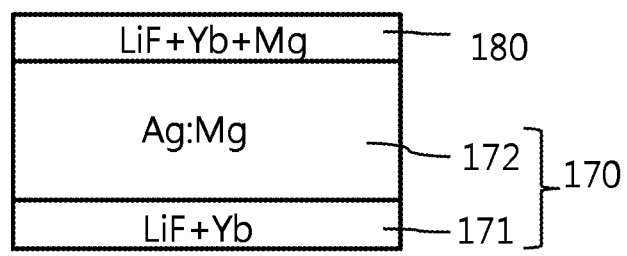

As illustrated in FIG. 5D, in the organic light-emitting element according to the ninth aspect of the present disclosure, both the first layer 171 and the interfacial compensation layer 180 include Yb, excluding the second layer 172. In this case, the first layer 171 is formed of LiF and Yb, the second layer 172 is formed of an Ag:Mg alloy, and the interfacial compensation layer 180 is formed of a mixture of LiF, Yb, and Mg.

Figure 5E:
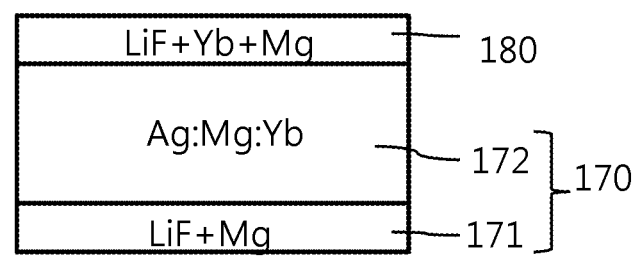

As illustrated in FIG. 5E, the organic light-emitting element according to the tenth aspect of the present disclosure has a difference in that Yb, which is included in the mixture of LiF and Yb of the first layer 171 according to the eighth aspect, is replaced with Mg. When Mg is included in the first layer 171 as the main metal component of the upper electrode 170, Ag cohesion in the second layer 172 may also be prevented by the first layer 171 thereunder.

In this way, the sixth to tenth aspects of FIGS. 5A to 5E are configured in common such that the interfacial compensation layer 180 is formed of a mixture of LiF, Yb, and Mg. Mg is included in the Ag:Mg alloy of the second layer 172, and functions to prevent cohesion of Ag. The interfacial compensation layer 180, which is formed by mixing the first material as a halogen compound, the second material as a metal that is greatly reactive with halogens or non-metals, and the third material as a metal included in the second layer 172 with each other, may stabilize the layer quality of the second layer 172, which contains Ag:Mg as a main component, thereby preventing Ag cohesion in the second layer 172 and stabilizing the surface properties thereof. Thereby, the upper electrode 170 may remain stable when driven for a long time, and the lifespan of the organic stack OS may be increased.

Figure 6A:
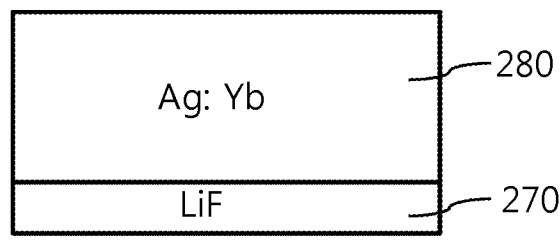
FIGS. 6A to 6C are cross-sectional views illustrating an upper electrode and an interfacial compensation layer of an organic light-emitting element according to an eleventh aspect to a thirteenth aspect of the present disclosure.
Figure 6B:
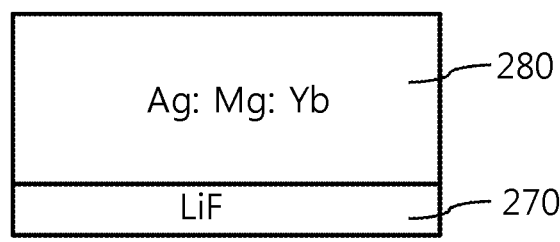
Figure 6C:
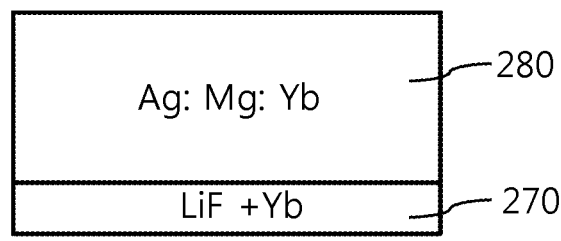

FIGS. 6A to 6C are cross-sectional views illustrating an upper electrode and an interfacial compensation layer of an organic light-emitting element according to an eleventh aspect to a thirteenth aspect of the present disclosure.

In the organic light-emitting element according to the eleventh aspect of the present disclosure illustrated in FIGS. 6A to 6C, when the upper electrode is formed in multiple layers, the uppermost metal layer of the upper electrode includes Yb so as to have the function of the interfacial compensation layer.

As illustrated in FIG. 6A, in the eleventh aspect of the present disclosure, the upper electrode includes a first layer 270 formed of LiF and a second layer 280 formed of Ag and Yb. At this time, Yb functions to prevent cohesion of Ag and has a low work function to thus assist in the smooth injection of electrons. In addition, even if LiF included in the first layer 270 is separated so that Li$^+$ ions are generated, Yb collects the Li$^+$ ions, which are highly reactive with F in order to prevent the Li$^+$ ions from moving into the organic light-emitting element, thereby preventing deterioration in the characteristics of the organic light-emitting element and deterioration in the lifespan thereof.

As illustrated in FIG. 6B, in the twelfth aspect of the present disclosure, the upper electrode includes the first layer 270 formed of LiF and the second layer 280 formed of an Ag:Yb:Mg alloy. At this time, Yb and Mg function to prevent cohesion of Ag and have a low work function to thus assist in the smooth injection of electrons. In addition, even if LiF included in the first layer 270 is extricated so that Li$^+$ ions are generated, Yb collects the Li$^+$ ions, which are highly reactive with F in order to prevent the Li$^+$ ions from moving into the organic light-emitting element, thereby preventing deterioration in the characteristics of the organic light-emitting element and deterioration in the lifespan thereof.

As illustrated in FIG. 6C, in the thirteenth aspect of the present disclosure, the upper electrode includes the first layer 270 formed of an inorganic compound of LiF and Yb and the second layer 280 formed of an Ag:Yb:Mg alloy of Ag, Yb, and Mg. At this time, Yb and Mg function to prevent cohesion of Ag and have a low work function to thus assist in the smooth injection of electrons. Compared to the twelfth aspect, Yb is further provided under the second layer 280 so that cohesion of Ag may be prevented at both the upper and lower sides, whereby the effects more than expected from the twelfth aspect may be obtained.

Hereinafter, the results of performing comparative experiments according to the above aspects and comparative examples will be described.

Figure 7:
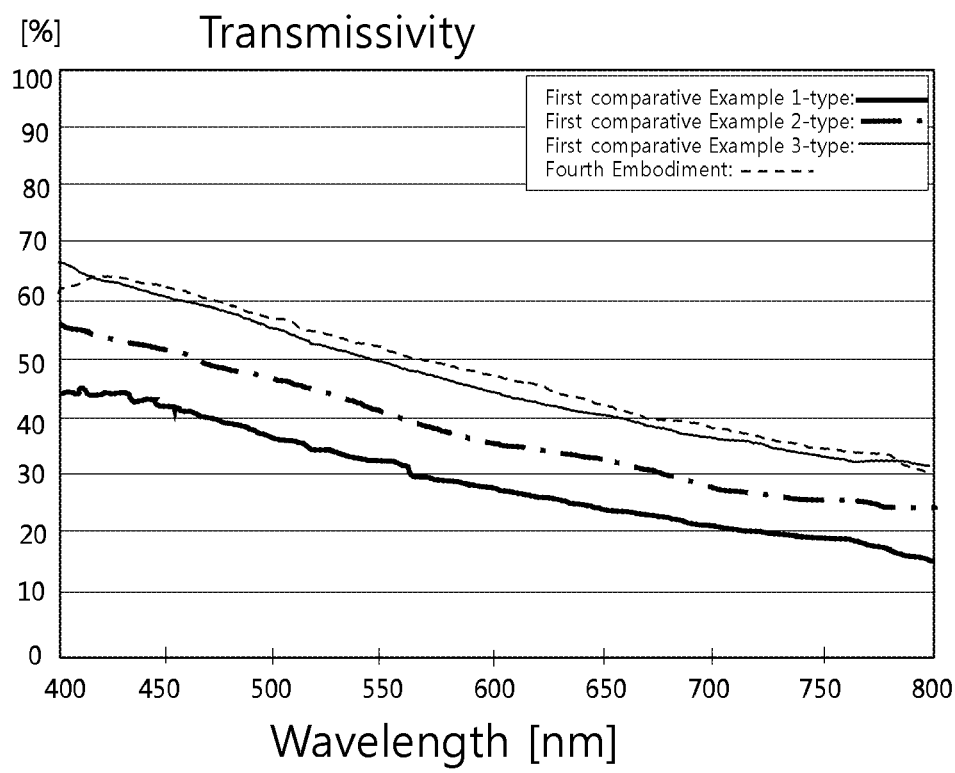
FIG. 7 is a graph illustrating transmissivity depending on wavelength according to various examples of the first comparative example and the fourth aspect of the present disclosure.

FIG. 7 is a graph illustrating transmissivity depending on wavelength according to various examples of the first comparative example and the fourth aspect of the present disclosure.

TABLE 1

| Experimental Example | First layer (Yb:LiF) Molar ratio_Thickness | Second layer (Ag:Mg) Molar ratio_Thickness | Interfacial Compensation Layer (Yb:LiF) Molar ratio_Thickness | Sheet Resistance (Ω/□) | Transmissivity (%) | | | |
|---|---|---|---|---|---|---|---|---|
| | | | | | 40 m | 80 m | 20 m | 00 m |
| First Comparative Example 1-type | None | 4:3:1_210 Å | None | 7.5 | 3.9 | 9.7 | 5.3 | 8.3 |

TABLE 1-continued

| Experimental Example | First layer (Yb:LiF) Molar ratio_Thickness | Second layer (Ag:Mg) Molar ratio_Thickness | Interfacial Compensation Layer (Yb:LiF) Molar ratio_Thickness | Sheet Resistance ($\Omega/\Box$) | Transmissivity (%) | | | |
|---|---|---|---|---|---|---|---|---|
| | | | | | 40 m | 80 m | 20 m | 00 m |
| First Comparative Example 2-type | None | 4:3:1_180 Å | None | 9.1 | 2.8 | 8.5 | 4.0 | 5.9 |
| First Comparative Example 3-type | None | 10:1_140 Å | None | 7.5 | 2.5 | 7.7 | 3.0 | 4.8 |
| Fourth Aspect | 2:1_18 Å | 10:1_140 Å | 2:1_18 Å | 7.7 | 2.2 | 7.4 | 2.7 | 4.5 |

As illustrated in FIG. 7 and Table 1, transmissivity increases as the thickness of the second layer (Ag:Mg), which is a main metal layer of the upper electrode, decreases. Thus, the first comparative example 3-type and the fourth aspect of the present disclosure, which adopt a small thickness of 140 Å, exhibit the highest transmissivity. In the organic light-emitting element, the thickness of the upper electrode decreases in order to increase luminous efficacy and prevent color deviation depending on viewing angle.

Accordingly, the first comparative example exhibits a result in which the transmissivity gradually increases as the thickness gradually decreases from 1-type to 3-type. The first comparative example 1-type and 2-type correspond to the case in which the atomic ratio of Ag:Mg is 4.3:1, and the thicknesses of the upper electrode are 210 Å and 180 Å respectively.

However, in the first comparative example 3-type in which the upper electrode has the smallest thickness, namely 140 Å, in order to reduce sheet resistance of the single Ag:Mg upper electrode, the content of Ag is ten times the content of Mg, based on the atomic ratio. Since Ag, which is much more abundant than Mg in the single layer, has cohesive force, the layer stability of the upper electrode may deteriorate over time, and the organic light-emitting element may fail to remain stable.

On the other hand, in the organic light-emitting element according to the fourth aspect of the present disclosure, as was found through experimentation, the transmissivity thereof is similar to or slightly exceeds that of the first comparative example 3-type, and through the provision of the Yb:LiF layers, which are provided as the interfacial compensation layer and the first layer above and under the second layer, which is the main metal layer, Yb contained in these layers prevents cohesion of Ag in the second layer, whereby the upper electrode may achieve interface stability and the organic light-emitting element may remain stable.

Although the organic light-emitting element of the present disclosure further includes the interfacial compensation layer and the first layer, which are formed of Yb and LiF, at the upper and lower sides of the second layer, compared to the first comparative example 3-type, these layers are much thinner than the second layer and have no effect on transmissivity. Thus, the organic light-emitting element has transmissivity similar to that of the first comparative example 3-type.

In addition, transmissivity tends to deteriorate as the wavelength is longer, but this depends on color visibility, rather than structural problems. Low transmissivity at a long wavelength may be solved by differentiating the thickness of respective emission layers in red, green, and blue subpixels, or transmissivity deviation may be solved by providing a separate compensation layer.

It should be noted that the organic light-emitting element of the present disclosure maintains the layer stability of the upper electrode, and consequently, maintains the stability thereof over time.

Figure 8:
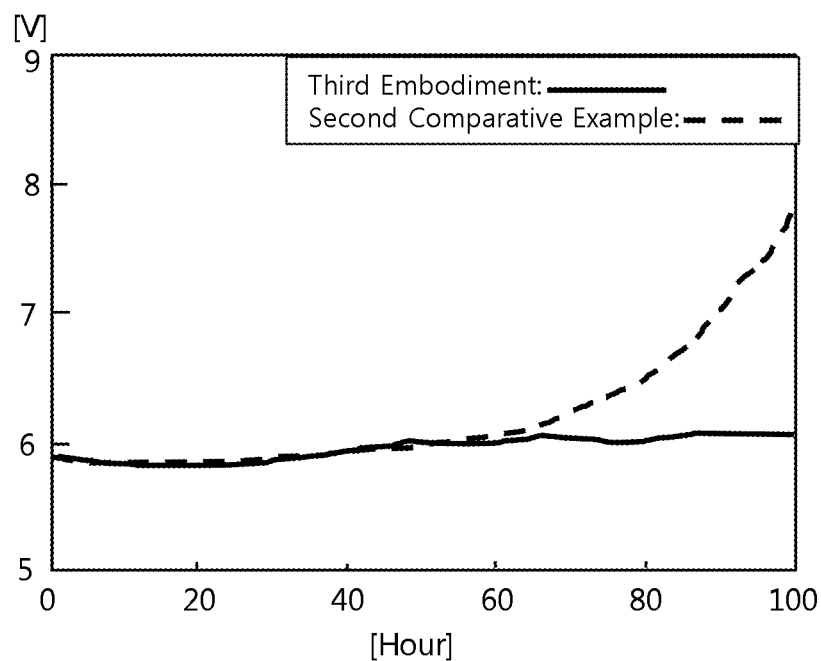
FIG. 8 is a graph illustrating variation in driving voltage over time when a green organic light-emitting element is realized according to the second comparative example and the third aspect of the present disclosure.
Figure 9:
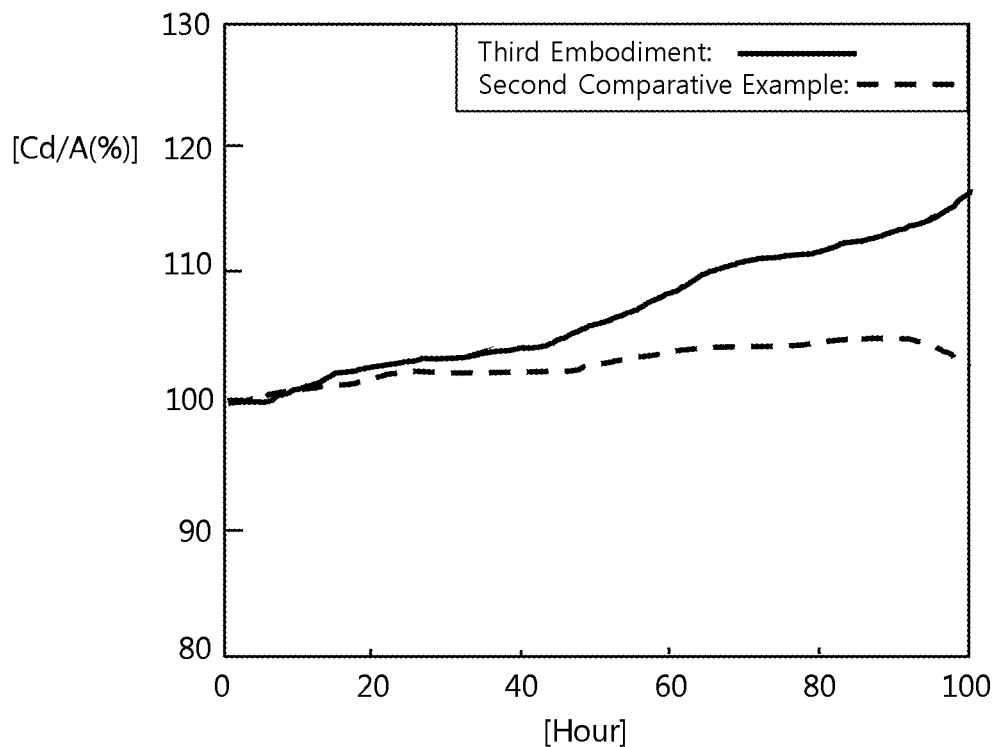
FIG. 9 is a graph illustrating variation in efficiency over time when the green organic light-emitting element is realized according to the second comparative example and the third aspect of the present disclosure.

FIG. 8 is a graph illustrating variation in driving voltage over time when a green organic light-emitting element is realized according to the second comparative example and the third aspect of the present disclosure, and FIG. 9 is a graph illustrating variation in efficiency over time when the green organic light-emitting element is realized according to the second comparative example and the third aspect of the present disclosure.

TABLE 2

| Experimental Example | Optical Property (UV 0 hour) | | | | Optical Property (UV 100 hour) | | | |
|---|---|---|---|---|---|---|---|---|
| | Driving Voltage (V) | Efficiency (%) | IEx | IEy | Driving Voltage (V) | Efficiency (%) | IEx | IEy |
| Second Comparative Example | 6.0 | 100 | .256 | .675 | 8.8 | 117 | .243 | .684 |
| Third Aspect | 6.0 | 100 | .254 | .678 | 6.3 | 102 | .244 | .684 |

In the second comparative example of the above experiment, as illustrated in FIG. 3B, the first layer was formed of Mg and LiF, and the second layer was formed of an Ag:Mg alloy. In the third aspect of the present disclosure, as illustrated in FIG. 4C, the first layer was formed of a compound of LiF and Yb, the second layer was formed of an Ag:Mg:Yb alloy, and the interfacial compensation layer was formed of a compound of LiF and Yb.

In this case, the organic light-emitting elements according to the second comparative example and the third aspect are based on FIG. 2, adopt the same configuration of the lower electrode and the organic stack including a plurality of stacks and a charge generation layer, but differ only in the upper electrode 170 and the interfacial compensation layer 180.

In the second comparative example and the third aspect, the thickness of the second layer was commonly 140 Å, and the thicknesses of the first layer and the interfacial compensation layer were in the range from 10 Å to 30 Å. In the third aspect of the present disclosure, the molar ratio of LiF:Yb in the first layer was 1:2, and the molar ratio of Ag:Mg:Yb in the second layer was 120:10:10.

In this case, in the initial state, the second comparative example and the third aspect of the present disclosure exhibit equivalent driving voltage and efficiency characteristics as well as similar CIEx and CIEy values. After exposure to UV light for 100 hours, as illustrated in Table 2 and FIG. 8, in the second comparative example, the driving voltage was increased by 2.8V, and the efficiency was increased beyond that of the initial state. This means that the corresponding organic light-emitting element failed to maintain stable.

In contrast, in the organic light-emitting element according to the third aspect of the present disclosure, variation in driving voltage was approximately 0.3V even after it was exposed to UV light for 100 hours, and efficiency remained similar to that in the initial state. This means that the corresponding organic light-emitting element remained stable.

That is, as in the third aspect of the present disclosure, when the interfacial compensation layer, which includes at least a halogen compound and a metal that is highly reactive with halogens and non-metals, is provided, the organic light-emitting element may remain stable.

Meanwhile, the reason why the inventors of the present disclosure considered UV characteristics in the above-described experiments is that organic light-emitting elements have recently been used not only in general indoor environments but also in display devices for use in the passenger compartment of a vehicle or exploration devices, and thus need to remain stable even when they undergo extreme variation in temperature or are exposed to solar radiation. However, general organic light-emitting element may be vulnerable to variation in heat or temperature or solar radiation due to the organic material therein, and therefore, there is a demand for the development of organic light-emitting elements having UV stability. The inventors of the present disclosure have recognized this problem and have developed the upper electrode in order to solve this problem. Through the provision of the interfacial compensation layer, the inventors have succeeded in developing an organic light-emitting element that is stable over time when exposed to UV light.

Figure 10A:
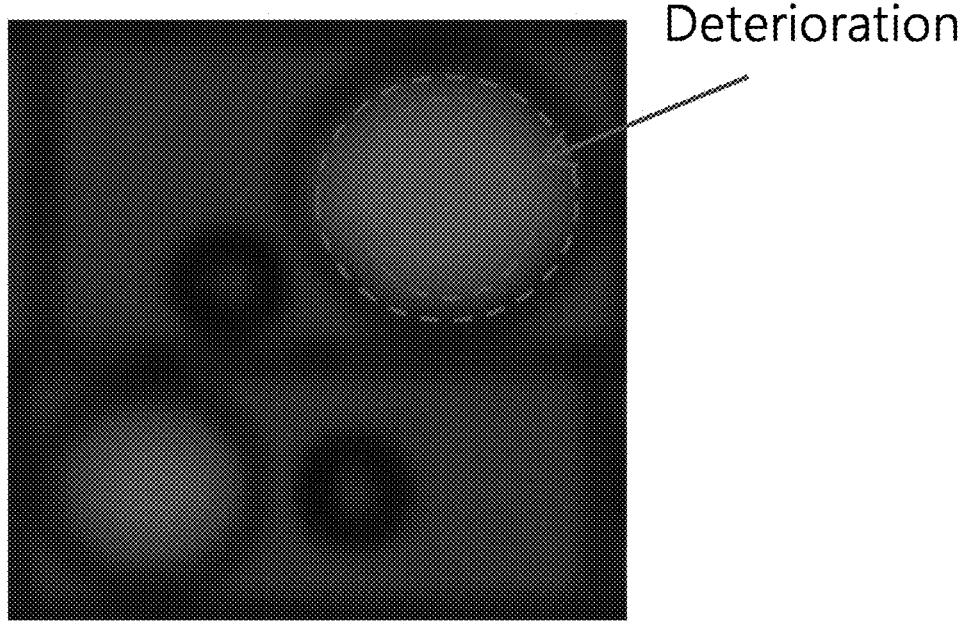
FIGS. 10A and 10B are optical pictures illustrating the state in which the green organic light-emitting element realized according to the second comparative example and the third aspect of the present disclosure is exposed to UV light for 100 hours.
Figure 10B:
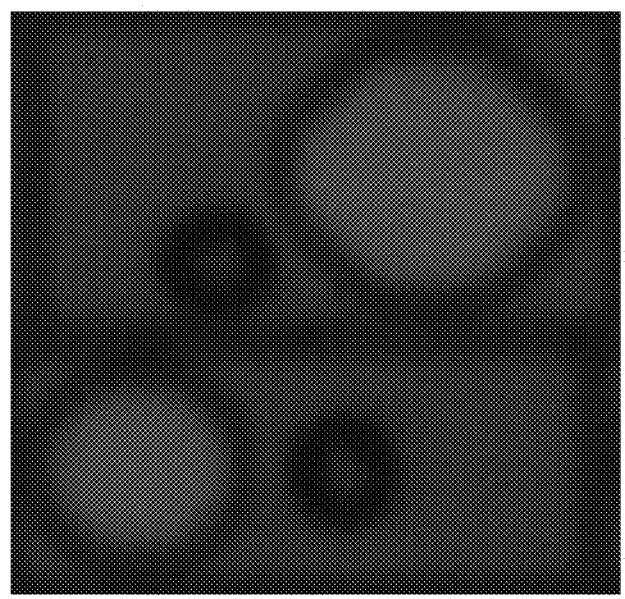

FIGS. 10A and 10B are optical pictures illustrating the state in which the green organic light-emitting element realized according to the second comparative example and the third aspect of the present disclosure is exposed to UV light for 100 hours.

As illustrated in FIG. 10A, the second comparative example shows that a light-emitting portion represented by a circle gradually deteriorates from the edge thereof. On the other hand, as illustrated in FIG. 10B, in the third aspect of the present disclosure, deterioration of the light-emitting portion was not observed after it was exposed to UV light for 100 hours.

Figure 11:
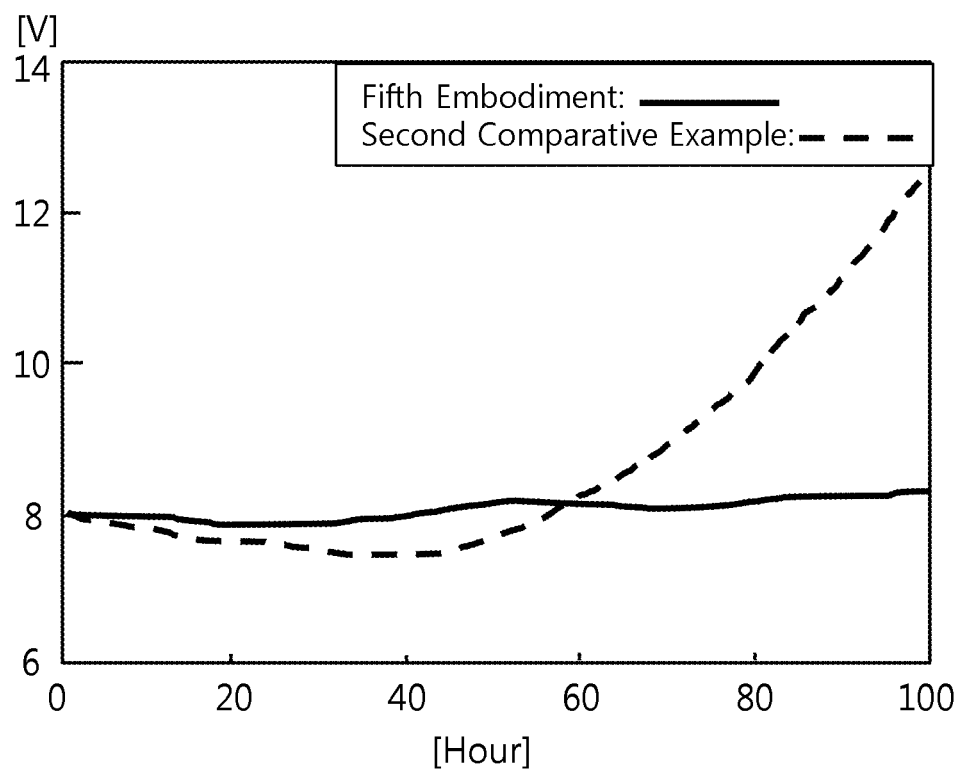
FIG. 11 is a graph illustrating variation in driving voltage over time when a red organic light-emitting element is realized according to the second comparative example and the fifth aspect of the present disclosure.
Figure 12:
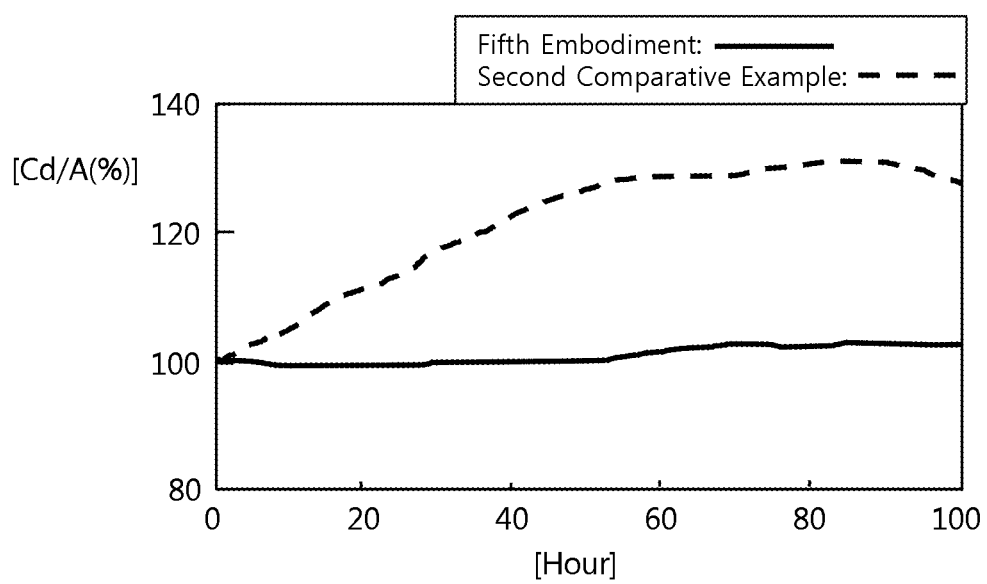
FIG. 12 is a graph illustrating variation in efficiency over time when the red organic light-emitting element is realized according to the second comparative example and the fifth aspect of the present disclosure.

FIG. 11 is a graph illustrating variation in driving voltage over time when a red organic light-emitting element is realized according to the second comparative example and the fifth aspect of the present disclosure, and FIG. 12 is a graph illustrating variation in efficiency over time when the red organic light-emitting element is realized according to the second comparative example and the fifth aspect of the present disclosure.

TABLE 3

| Experimental Example | Optical Property (UV 0 hour) | | | | Optical Property (UV 100 hour) | | | |
| --- | --- | --- | --- | --- | --- | --- | --- | --- |
| | Driving Voltage (V) | Efficiency (%) | IEx | IEy | Driving Voltage (V) | Efficiency (%) | IEx | IEy |
| Second Comparative Example | 8.0 | 100 | .691 | .306 | 13.5 | 125 | .691 | .306 |
| Fifth Aspect | 8.0 | 100 | .691 | .306 | 8.3 | 104 | .691 | .306 |

In the second comparative example of the above experiment, as illustrated in FIG. 3B, the first layer was formed of Mg and LiF, and the second layer was formed of an Ag:Mg alloy. In the fifth aspect of the present disclosure, as illustrated in FIG. 4E, the first layer was formed of a compound of LiF and Mg, the second layer was formed of an Ag:Mg:Yb alloy, and the interfacial compensation layer was formed of a compound of LiF and Yb.

The reason why the results of Table 3 and FIGS. 11 and 12 differ from the results of the green organic light-emitting element described above is that a relatively high driving voltage is required in the initial state in order to emit red light, and thus variation in driving voltage is increased in the second comparative example after it was exposed to UV light.

In this case, the organic light-emitting elements according to the second comparative example and the fifth aspect are based on FIG. 2, adopt the same configuration of the lower electrode and the organic stack including a plurality of stacks and a charge generation layer, but differ only in the upper electrode 170 and the interfacial compensation layer 180.

In the second comparative example and the fifth aspect, the thickness of the second layer was commonly 140 Å, and the thicknesses of the first layer and the interfacial compensation layer were in the range from 10 Å to 30 Å. In the third aspect of the present disclosure, the molar ratio of LiF:Mg in the first layer was 1:2, and the molar ratio of Ag:Mg:Yb in the second layer was 120:10:10.

In this case, in the initial state, the second comparative example and the fifth aspect of the present disclosure exhibit equivalent driving voltage and efficiency characteristics as well as similar CIEx and CIEy values. After exposure to UV light for 100 hours, as illustrated in Table 3 and FIG. 11, in the second comparative example, the driving voltage was increased by 5.5V, and the efficiency was increased beyond that of the initial state, as illustrated in FIG. 12. This means that the corresponding organic light-emitting element failed to remain stable.

In contrast, in the organic light-emitting element according to the fifth aspect of the present disclosure, as illustrated in FIGS. 11 and 12, variation in driving voltage was approximately 0.3V even after it was exposed to UV light for 100 hours, and efficiency remained similar to that in the initial state (the efficiency was increased by 4%, but it can be seen that difference thereof is remarkably small). This means that the corresponding organic light-emitting element remained stable.

That is, as in the fifth aspect of the present disclosure, when the interfacial compensation layer, which includes at least a halogen compound and a metal that is highly reactive with halogens and non-metals, is provided, the organic light-emitting element may remain stable.

Figure 13A:
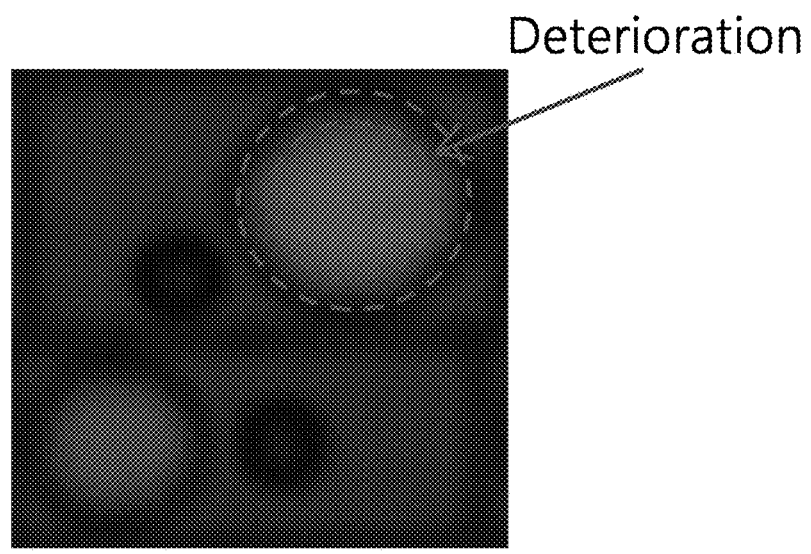
FIGS. 13A and 13B are optical pictures illustrating the state in which the red organic light-emitting element realized according to the second comparative example and the fifth aspect of the present disclosure is exposed to UV light for 100 hours.
Figure 13B:
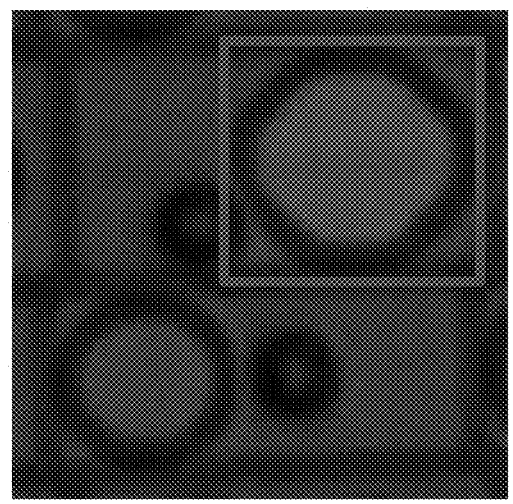

FIGS. 13A and 13B are optical pictures illustrating the state in which the red organic light-emitting element realized according to the second comparative example and the fifth aspect of the present disclosure is exposed to UV light for 100 hours.

As illustrated in FIG. 13A, the second comparative example shows that a light-emitting portion represented by a circle gradually deteriorates from the edge thereof. On the other hand, as illustrated in FIG. 13B, in the fifth aspect of the present disclosure, deterioration of the light-emitting portion was not observed after it was exposed to UV light for 100 hours.

Meanwhile, the above-described experiments were performed according to the third to fifth aspects of the present disclosure, and it can be understood that a similar level of stability may be obtained as long as the interfacial compensation layer includes both the first material, which is a halogen compound, and the second material, which is a metal that is reactive with halogens or non-metals, or the interfacial compensation layer further includes the third material, which is a metal constituting the upper electrode, in addition to the first and second materials.

Figure 14:
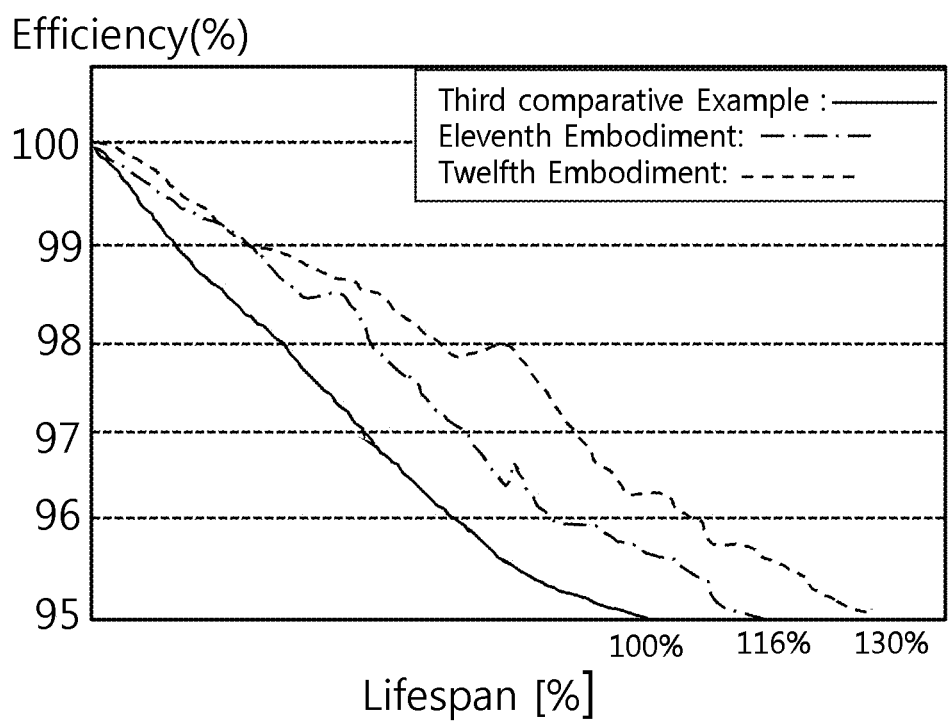
FIG. 14 is a graph illustrating variation in brightness at room temperature when a blue organic light-emitting element is realized according to a third comparative example and the eleventh and twelfth aspects of the present disclosure.

FIG. 14 is a graph illustrating variation in brightness at room temperature when a blue organic light-emitting element is realized according to the third comparative example and the eleventh and twelfth aspects of the present disclosure.

TABLE 4

| Experimental Example | First Metal Layer | Second Metal Layer | Optical Property | | | | Room Temperature Lifespan (%) |
|---|---|---|---|---|---|---|---|
| | | | Driving Voltage (V) | Efficiency (%) | IEx | IEy | |
| Third Comparative Example | Yb:LiF (1:1) (20 Å) | Ag:Mg (110:10) (120 Å) | 7.5 | 95 | .139 | .061 | 100 |
| Eleventh Aspect | LiF (10 Å) | Ag:Yb (120:20) (140 Å) | 7.5 | 95 | .137 | .065 | 130 |
| Twelfth Aspect | LiF (10 Å) | Ag:Mg:Yb (120:10:10) (140 Å) | 7.5 | 95 | .137 | .064 | 116 |

FIG. 14 and Table 4 illustrate the organic light-emitting elements according to the third comparative example and the eleventh and twelfth aspects of the present disclosure illustrated in FIGS. 6A and 6B, and illustrate an experimental example of a blue light-emitting element having a blue emission layer. In the Table 4, the Room Temperature lifespans (%) according to the Third comparative Example and Eleventh and Twelfth Aspects are compared at Efficiency 95% to the initial efficiency.

In the experiments, the lifespan is the lifespan at room temperature when no UV exposure is performed. As represented by the experimental examples, when a metal that is highly reactive is included in the second layer, which is the uppermost layer of the upper electrode, rather than being provided in the first layer, the organic light-emitting element may achieve an increased lifespan at room temperature.

The third comparative example and the eleventh and twelfth aspects exhibit equivalent driving voltage and efficiency characteristics as well as similar CIEx and CIEy values.

Accordingly, when the upper electrode is formed to have a small thickness, in order to more effectively prevent cohesion of Ag, which is much more abundant than other metals in the upper electrode, the metal having high reactivity may be provided in the second layer of the upper electrode, rather than being provided in the first layer.

Figure 15A:
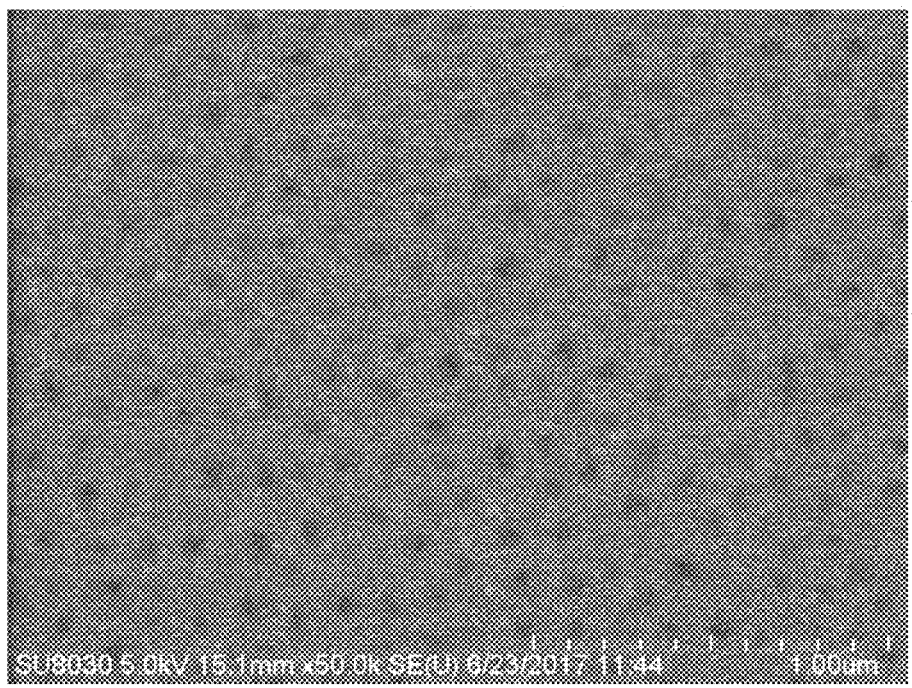
FIGS. 15A and 15B are optical pictures illustrating the state in which the blue organic light-emitting element realized according to the third comparative example and the eleventh aspect of the present disclosure is exposed to UV light for 100 hours.
Figure 15B:
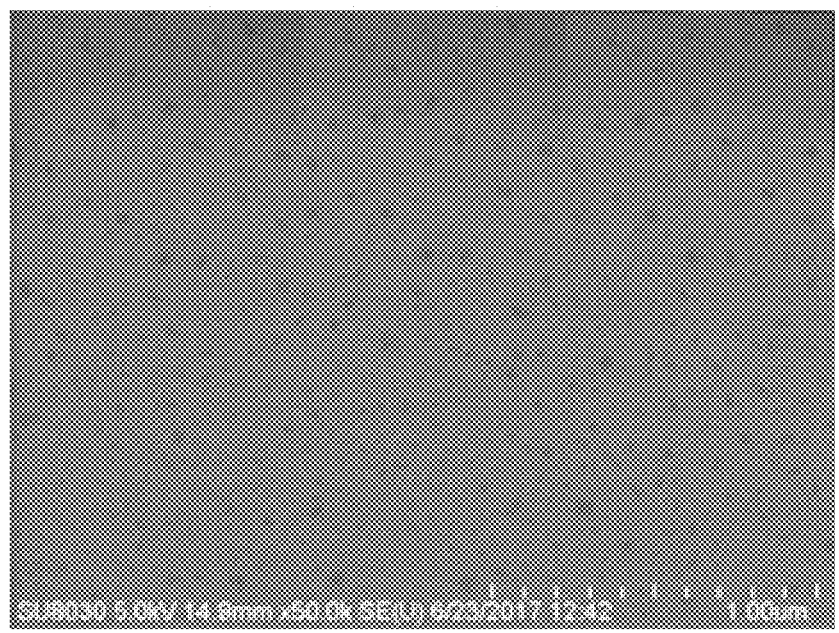

FIGS. 15A and 15B are optical pictures illustrating the state in which the blue organic light-emitting element realized according to the third comparative example and the eleventh aspect of the present disclosure is exposed to UV light for 100 hours.

As can be seen by observing the state after the organic light-emitting elements of the third comparative example and the eleventh aspect were exposed to UV light for 100 hours, cohesion of Ag occurs in the third comparative example, as illustrated in FIG. 15A, whereas no cohesion occurs in the eleventh aspect.

Figure 16:
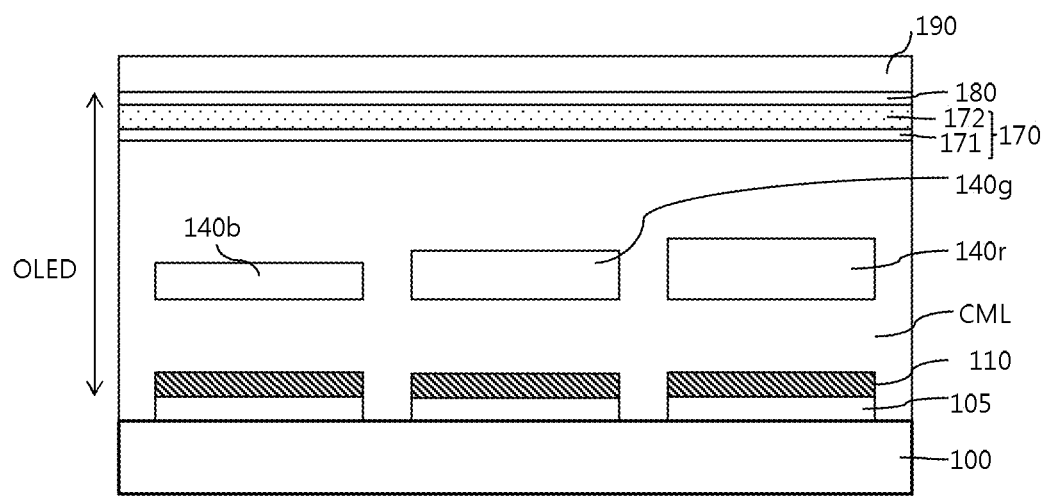
FIG. 16 is a cross-sectional view illustrating an explanatory organic light-emitting display device of the present disclosure.

FIG. 16 is a cross-sectional view illustrating an organic light-emitting display device of the present disclosure.

As illustrated in FIG. 16, the organic light-emitting display device of the present disclosure includes a substrate 100 having a plurality of subpixels, a thin-film transistor 105 provided in each of the subpixels, and the above-described organic light-emitting element, such as an organic light-emitting diode (OLED), connected to the thin-film transistor 105.

In each subpixel, the thin-film transistor 105 is connected to the lower electrode 110 of the organic light-emitting element, and the configuration there-above is based on FIG. 1 or 2. As illustrated, the thin-film transistor 105 and the lower electrode 110 may be in contact with each other throughout the surfaces thereof. Alternatively, the thin-film transistor 105 and the lower electrode 110 may be connected to each other through a contact hole, which is formed in a portion of an insulating layer interposed therebetween.

In the organic light-emitting element, in each subpixel, the lower electrode 110, a blue emission layer 140b, a green emission layer 140g, and a red emission layer 140r are provided. Other layers including a hole injection layer, a hole transport layer, and an electron transport layer take the form of a common layer CML, which is provided over the respective subpixels. The upper electrode 170 and the interfacial compensation layer 180 are further provided on an organic stack including the blue emission layer 140b, the green emission layer 140g, the red emission layer 140r, and the common layer CML.

In addition, the blue emission layer 140b, the green emission layer 140g, and the red emission layer 140r may have different thicknesses based on the resonance of color of light emitted therefrom.

The common layer, such as the electron transport layer, is provided above the blue emission layer 140b, the green emission layer 140g, and the red emission layer 140r, and the upper electrode 170 and the interfacial compensation layer 180 are further provided there-above.

The capping layer 190 is further provided on the interfacial compensation layer 180 in order to protect the organic light-emitting element. Although not illustrated, a thin-film encapsulation structure, in which an organic layer and an inorganic layer are alternately laminated, may further be provided on the capping layer 190.

Here, the upper electrode 170 and the interfacial compensation layer 180 may be replaced with those of the first to thirteenth aspects of the present disclosure described above. With this configuration, it is possible to reduce the thickness of the upper electrode, and to ensure that a metal included in the interfacial compensation layer prevents cohesion of Ag, which is included at a high molar ratio in the upper electrode in order to achieve high conductivity, whereby the upper electrode may remain stable, and consequently, the organic light-emitting display device may remain stable and achieve increased reliability regardless of whether it is at room temperature or is in an extreme environment such as UV exposure.

As is apparent from the above description, an organic light-emitting element and an organic light-emitting display device using the same according to the present disclosure have the following effects.

First, by further providing an interfacial compensation layer on the exit side of an upper electrode, it is possible to prevent variation in driving voltage or luminous efficacy caused when the upper electrode is exposed to UV light at room temperature. Thereby, UV reliability may be improved.

Second, the interfacial compensation layer serves to compensate for instability of the surface of the upper electrode that may be caused when the upper electrode is formed of a translucent metal such as AgMg and the thickness thereof is reduced. In addition, the interfacial compensation layer may prevent cohesion of Ag, which enables the amount of Mg contained in the upper electrode to be reduced, and may result in the increased conductivity of the upper electrode. In addition, the thickness of the interfacial compensation layer is ⅕ to 1/10 of the thickness of the upper electrode, which may reduce color deviation depending on viewing angle, compared to that in a single upper electrode structure. In addition, the interfacial compensation layer, which is in contact with the upper electrode, is formed of a material that has no effect on the transmission of light, and is capable of compensating for the interface of the upper electrode without optical loss.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure.

What is claimed is:

1. An organic light-emitting element comprising:
a lower electrode;
at least one organic layer on the lower electrode;
an upper electrode disposed on the organic layer and transmitting light from the at least one organic layer; and
an interfacial compensation layer disposed on the upper electrode and including a first material of a halogen compound and a second material of a metal that is reactive with halogen or other non-metal,
wherein the upper electrode includes at least a first layer and a second layer, and
wherein the first material of the interfacial compensation layer is a compound of halogen and a metal included in the first layer that is in contact with the at least one organic layer.

2. The organic light-emitting element according to claim 1, wherein the second material includes one or more of barium (Ba), cerium (Ce), cesium (Cs), europium (Eu), gadolinium (Gd), potassium (K), lithium (Li), lutetium (Lu), sodium (Na), neodymium (Nd), rubidium (Rb), scandium (Sc), samarium (Sm), strontium (Sr), ytterbium (Yb), and yttrium (Y).

3. The organic light-emitting element according to claim 1, wherein the interfacial compensation layer further comprises a third material of a metal included in the upper electrode.

4. The organic light-emitting element according to claim 3, wherein the second material of the interfacial compensation layer has a highest molar ratio, and the first material and the third material have a same molar ratio.

5. The organic light-emitting element according to claim 3, wherein the interfacial compensation layer has a thickness in a range of 10Å to 30Å.

6. The organic light-emitting element according to claim 1, wherein the upper electrode includes Ag:Mg.

7. The organic light-emitting element according to claim 6, wherein the first material includes LiF and the second material includes Yb in the interfacial compensation layer.

8. The element according to claim 7, wherein a molar ratio of Yb to LiF is greater than 1:1 and equal to or less than 2:1 in the interfacial compensation layer.

9. The organic light-emitting element according to claim 7, further comprising Mg in the molar ratio equal to or smaller than the second material in the interfacial compensation layer.

10. The organic light-emitting element according to claim 7, wherein a molar ratio of Yb is higher than that of the LiF in the interfacial compensation layer.

11. The organic light-emitting element according to claim 1, wherein the first material is LiF.

12. The organic light-emitting element according to claim 1, wherein the upper electrode is formed by laminating one or more metal layers,
wherein the second material is included in the at least one metal layer of the upper electrode.

13. The organic light-emitting element according to claim 1, wherein the first layer includes LiF, and the second layer includes Ag:Mg.

14. The organic light-emitting element according to claim 13, wherein the first material includes LiF and the second material includes Yb, and a molar ratio of Yb is higher than that of the LiF in the interfacial compensation layer.

15. The organic light-element according to claim 14, wherein the molar ratio of Yb to LiF is greater than 1:1 and equal to or less than 2:1 in the interfacial compensation layer.

16. The organic light-emitting element according to claim 14, further comprising Mg in the molar ratio equal to or smaller than the second material in the interfacial compensation layer.

17. The organic light-emitting element according to claim 13, wherein Ag in the second layer has a molar ratio of three times to ten times that of Mg.

18. The organic light-emitting element according to claim 1, wherein a sum of thicknesses of the upper electrode and the interfacial compensation layer in a range of 100Å to 180Å.

19. The organic light-emitting element according to claim 1, wherein the interfacial compensation layer has a thickness in a range of 10Å to 30Å.

20. The organic light-emitting element according to claim 1, wherein the interfacial compensation layer is directly disposed on the upper electrode where light comes out.

21. An organic light-emitting display device comprising:
a substrate where a plurality of subpixels is defined;
a thin-film transistor disposed in each of the subpixels; and
an organic light-emitting element connected to the thin-film transistor,
wherein the organic light-emitting element comprising:
a lower electrode;
at least one organic layer on the lower electrode;
an upper electrode disposed on the at least one organic layer and transmitting light from the at least one organic layer; and
an interfacial compensation layer disposed on the upper electrode and including a first material of a halogen compound and a second material of a metal that is reactive with halogen or other non-metal,
wherein the upper electrode includes at least a first layer and a second layer, and
wherein the first material of the interfacial compensation layer is a compound of halogen and a metal included in the first layer that is in contact with the at least one organic layer.

22. An organic light-emitting display device according to claim 21, further comprising a capping layer on the interfacial compensation layer, wherein the capping layer is formed of an organic compound having transmissivity and has refractive index ranging from 1.6 to 2.1.

* * * * *